(12) United States Patent
Fukuhara

(10) Patent No.: US 7,436,491 B2
(45) Date of Patent: Oct. 14, 2008

(54) EXPOSURE SYSTEM, EXPOSURE METHOD AND METHOD FOR MANUFACTURING A SEMICONDUCTOR DEVICE

(75) Inventor: Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 492 days.

(21) Appl. No.: 11/298,706

(22) Filed: Dec. 12, 2005

(65) Prior Publication Data
US 2006/0132748 A1    Jun. 22, 2006

(30) Foreign Application Priority Data
Dec. 20, 2004   (JP)   ............... P2004-368098

(51) Int. Cl.
G03B 27/72    (2006.01)
G03B 27/42    (2006.01)
G03B 27/54    (2006.01)

(52) U.S. Cl. ............... 355/71; 355/53; 355/67

(58) Field of Classification Search ........ 355/53, 355/67, 71, 77
See application file for complete search history.

(56) References Cited

U.S. PATENT DOCUMENTS

| | | | |
|---|---|---|---|
| 5,459,000 A | 10/1995 | Unno | |
| 5,815,247 A | 9/1998 | Poschenrieder et al. | |
| 6,045,976 A | 4/2000 | Haruki et al. | |
| 6,842,223 B2 * | 1/2005 | Tyminski | 355/53 |
| 2004/0057036 A1 | 3/2004 | Kawashima et al. | |
| 2004/0201831 A1 | 10/2004 | Tyminski | |
| 2005/0007473 A1 | 1/2005 | Theil et al. | |
| 2005/0007573 A1 | 1/2005 | Hansen et al. | |

FOREIGN PATENT DOCUMENTS

| | | |
|---|---|---|
| JP | 06-053120 | 2/1994 |
| JP | 3246615 | 11/2001 |
| WO | WO 2005/027207 A1 | 3/2005 |

OTHER PUBLICATIONS

English Translation of JP 06-053120 (dated (Feb. 25, 1994).*
English Translation of JP 3246615 (dated (Nov. 2, 2001).*
Search Report issued by the Netherlands Patent Office on Oct. 15, 2007, for Netherlands Patent Application No. 135724.

* cited by examiner

*Primary Examiner*—Alan A Mathews
(74) *Attorney, Agent, or Firm*—Finnegan, Henderson, Farabow, Garrett & Dunner, L.L.P.

(57) ABSTRACT

An exposure system includes: an illumination optical system defining, in an effective illumination source plane, a center region forming a perpendicularly incident light and first and second eccentric regions forming obliquely incident lights having a perpendicular electric vector component perpendicular to a straight line connecting the first and second eccentric regions, the electric vector component being larger than a parallel electric vector component parallel to the straight line, and illuminating the mask pattern with the perpendicularly incident light and the obliquely incident lights; and a projection optical system projecting an image of the mask pattern to a processing object.

20 Claims, 14 Drawing Sheets

EXPOSURE SYSTEM, EXPOSURE METHOD AND METHOD FOR MANUFACTURING A SEMICONDUCTOR DEVICE

CROSS REFERENCE TO RELATED APPLICATIONS AND INCORPORATED BY REFERRENCE

The application is based upon and claims the benefit of priority from the prior Japanese Patent Applications No. P2004-368098, filed on Dec. 20, 2004; the entire contents of which are incorporated herein by reference.

BACKGROUND OF THE INVENTION

1. Field of the Invention

The present invention relates to technology for manufacturing a semiconductor device, more particularly, to an exposure system, an exposure method and a method for manufacturing a semiconductor device.

2. Description of the Related Art

In a photolithography process for manufacturing a semiconductor device, illumination light emitted from an effective illumination source (secondary illumination source) formed in an illumination optical system illuminates a mask pattern provided on a photomask (reticle). The illumination light diffracted at the photomask is concentrated on a resist film applied on a semiconductor substrate by a projection optical system. An optical image is formed on the resist film, and the resist film is exposed by the optical image. The resist film is then developed, thus forming a resist pattern.

A light intensity distribution of the light illuminating the photomask is represented by a light intensity (luminance) distribution (hereinafter, referred to as illumination) of the effective illumination source. The illumination can be controlled by a zoom lens or a diffractive optical element on an incident side of a fly-eye lens or a filter (illumination aperture) provided on an effective illumination source plane. The shape of the illumination that is suitable for the shape of the resist pattern, such as normal illumination or annular illumination, is formed by controlling an illumination coherence factor σ indicating size of the effective illumination source.

In the photolithography process, for example, in the case of manufacturing a flash memory, a row of hole patterns cyclically aligned in one direction is formed as the resist pattern. One cycle of the repeating hole patterns in the alignment direction (hereinafter, referred to as a cyclic direction) has a length not more than the wavelength of light on the substrate, which is close to a resolution limit of the exposure system. Such a fine resist pattern is difficult to form even using the normal or annular illumination.

To form a fine resist pattern, a "tripole illumination" including three regions of maximum light intensity is used as the effective illumination source. The tripole illumination includes a center region of maximum light intensity located in the center of the effective illumination source and two eccentric regions of the maximum light intensity located near the edge of the effective illumination source, so as to be opposite to each other across the center region. For example, in forming the row of hole patterns, the direction that the center region and the two eccentric regions are aligned is set parallel to the cyclic direction of the rows of hole patterns. This makes it possible to obtain a resolution effective for forming the row of fine hole patterns and reduce dimensional variation (dimensional errors) of the hole patterns due to exposure amount errors and focus errors. In other words, exposure with a large process window can be achieved.

However, the patterns are increasingly miniaturized, and in the case of forming a fine resist pattern such as a row of hole patterns having a cycle length not more than three quarter wavelength, a sufficient process window cannot be obtained in some cases, even using the tripole illumination. Thus, there is a problem of increasing dimensional variation in the resist pattern.

SUMMARY OF THE INVENTION

An aspect of the present invention inheres in an exposure system including: an illumination optical system configured to define, in an effective illumination source plane, a center region forming a perpendicularly incident light having an optical axis perpendicular to a plane of a mask pattern and first and second eccentric regions being opposite to each other with regard to the center region in the effective illumination source plane, each of the first and second eccentric regions forming an obliquely incident light having an optical axis oblique to the plane of the mask pattern and having a perpendicular electric vector component perpendicular to a straight line connecting the first and second eccentric regions in the effective illumination source plane, the electric vector component being larger than a parallel electric vector component parallel to the straight line, and to illuminate the mask pattern with the perpendicularly incident light and the obliquely incident lights; and a projection optical system configured to project an image of the mask pattern to a processing object with the perpendicularly incident light and the obliquely incident lights.

Another aspect of the present invention inheres in an exposure method including: forming, from a center region in an effective illumination source plane, a perpendicularly incident light having an optical axis perpendicular to a plane of a mask pattern; forming obliquely incident lights having an optical axis oblique to the plane of the mask pattern, from each of first and second eccentric regions opposite to each other with regard to the center region in the effective illumination source plane, and having a perpendicular electric vector component perpendicular to a straight line connecting the first and second eccentric regions, the perpendicular electric vector component being larger than a parallel electric vector component parallel to the straight line; illuminating the mask pattern with the perpendicularly incident light and the obliquely incident lights; and projecting an image of the mask pattern on a processing object.

Further aspect of the present invention inheres in a method for manufacturing a semiconductor device including: coating a resist film on a semiconductor wafer; forming, from a center region in an effective illumination source plane, a perpendicularly incident light having an optical axis perpendicular to a plane of a mask pattern; forming obliquely incident lights having an optical axis oblique to the plane of the mask pattern, from each of first and second eccentric regions opposite to each other with regard to the center region in the effective illumination source plane, and having a perpendicular electric vector component perpendicular to a straight line connecting the first and second eccentric regions, the perpendicular electric vector component being larger than a parallel electric vector component parallel to the straight line; illuminating the mask pattern with the perpendicularly incident light and the obliquely incident lights; projecting an image of the mask pattern to the resist film; developing the resist film so as to form a resist pattern; and processing the semiconductor substrate by using the resist pattern as a processing mask.

DETAILED DESCRIPTION OF THE INVENTION

Figure 1:
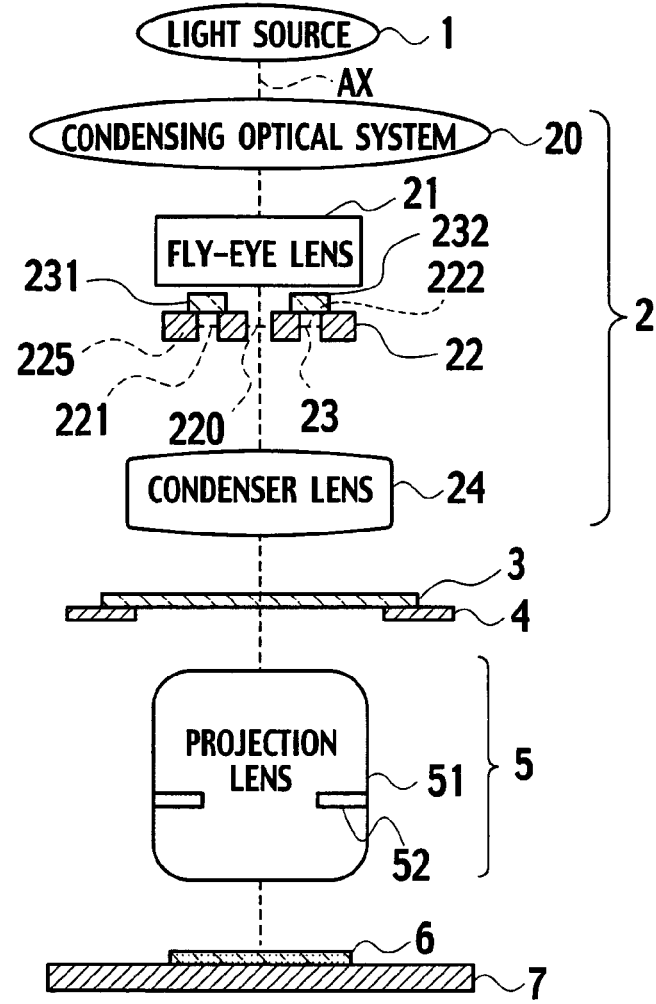
FIG. 1 is a schematic cross-sectional view showing an example of an exposure system according to an embodiment of the present invention.

An embodiment and various modifications of the present invention will be described with reference to the accompanying drawings. It is to be noted that the same or similar reference numerals are applied to the same or similar parts and elements throughout the drawings, and the description of the same or similar parts and elements will be omitted or simplified.

As shown in FIG. 1, an exposure system according to an embodiment of the present invention includes an illumination optical system 2 and a projection illumination system 5. The illumination optical system 2 defines a center region (light transmitting region) 220 and first and second eccentric regions (light transmitting regions) 221 and 222 in an effective illumination source plane 23.

The center region 220 forms a perpendicularly incident light having an optical axis perpendicular to a plane of a mask pattern. The first and second eccentric regions 221 and 222 are opposite to each other with regard to the center region 220 in the effective illumination source plane 23. Each of the first and second eccentric regions 221 and 222 forms an obliquely incident light having an optical axis oblique to the plane of the mask pattern. In each of the obliquely incident lights in the regions 221 and 222, a perpendicular electric vector component perpendicular to a straight line connecting the first and second eccentric regions 221 and 222 is larger and more dominant than a parallel electric vector component parallel to the straight line. The illumination optical system 2 illuminates a mask pattern with the perpendicularly incident light and obliquely incident lights. The projection optical system 5 projects an image of the mask pattern onto a processing object (wafer) 6 with the perpendicularly incident light and obliquely incident lights.

The exposure system is, for example, a stepper with a reduction ratio of ¼. The reduction ratio is not limited to ¼ and may be any reduction ratio. As the exposure system, in addition to the stepper, a scanner can be used. Furthermore, it is obvious that the present invention can be applied to, not only the refraction type exposure system, but also a reflection type exposure system, catadioptric type, or the like.

The exposure system includes a light source 1, the illumination optical system 2, a mask stage 4, the projection optical system 5, and a wafer stage 7. The light source 1 is, for example, an argon fluoride (ArF) excimer laser source with a wavelength λ of 193 nm. In addition to the ArF excimer laser source, the light source 1 may be a fluorine ($F_2$) excimer laser source with a wavelength λ of 157 nm, a krypton fluoride (KrF) excimer laser source with a wavelength λ of 248 nm, or the like. Furthermore, the light source 1 is not limited to the excimer laser sources, and can be a light source emitting ultraviolet light (i ray) with a wavelength λ of 365 nm, extreme ultraviolet light (EUV) with a wavelength λ of 10 to 20 nm, or the like.

The illumination optical system 2 includes a condensing optical system 20, a fly-eye lens 21, an illumination aperture 22, and a condenser lens 24. The condensing optical system 20 concentrates the illumination light from the light source 1. The fly-eye lens 21 equalizes the light intensity distribution of the illumination light from the condensing optical system 20.

Figure 2:
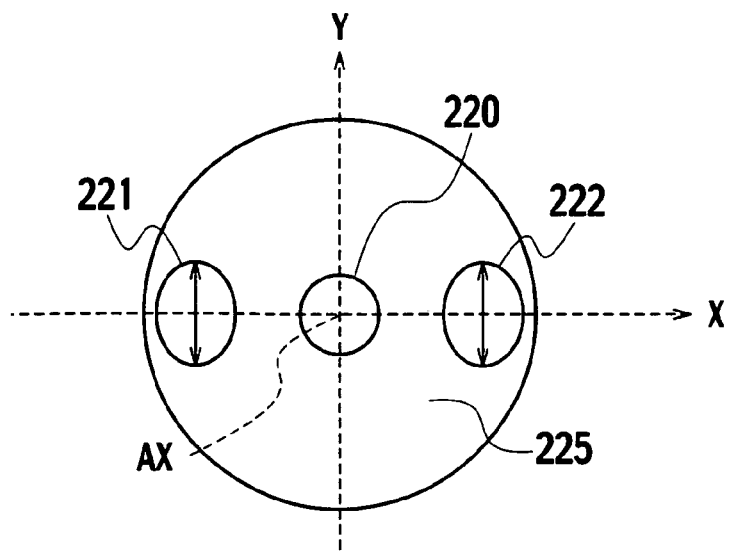
FIG. 2 is a plane view showing an example of tripole illumination according to the embodiment of the present invention.

The illumination aperture 22 is disposed in the effective illumination source plane 23. The effective illumination source plane 23 is substantially equal to a plane which has a Fourier transform relationship with a plane of the mask pattern 3, that is, a plane of the Fourier transform relationship of the plane of the mask pattern 3. The illumination aperture 22 selectively intercepts light to define the tripole illumination as shown in FIG. 2 as the illumination.

The tripole illumination includes the center region 220 with the maximum light intensity, the first and second eccentric regions 221 and 222 with the maximum light intensity which are opposite to each other across the center region 220, and a peripheral region 225 around the center region 220 and the first and second eccentric regions 221 and 222. The peripheral region 225 has a light intensity smaller than that of the center region 220 and the first and second eccentric regions 221 and 222. In the outer edge of the peripheral region 225, the illumination coherence factor σ is 1.

The first and second eccentric regions 221 and 222 are located at equal distances from the center region 220 on the straight line passing the center of the effective illumination source so as to be opposite to each other. The center region 220 and the first and second eccentric regions 221 and 222 correspond to apertures of the illumination aperture 22. The first and second eccentric regions 221 and 222 form light regions (obliquely incident lights) obliquely illuminating the mask pattern of the photomask 3. The center region 220 forms a light (perpendicularly incident light) perpendicularly illuminating the mask pattern. A light beam passing through the peripheral region 225 has less intensity than that of the perpendicularly incident light passing through the center region 220 and the obliquely incident lights passing through the first and second eccentric regions 221 and 222.

The light emitted from the light source 1 shown in FIG. 1 is, for example, circular polarized light or unpolarized light. Polarizers 231 and 232 are provided on the illumination aperture 22 on optical paths passing through the first and second eccentric regions 221 and 222, respectively. The polarizers 231 and 232 allow passage of only predetermined linear polarized light waves among components of the incident light. For example, the polarizers 231 and 232 are oriented so that, among the components of the obliquely incident lights passing through the first and second eccentric regions 221 and 222 shown in FIG. 2, only the light waves whose electric vectors vibrate in a direction (Y-axis direction) perpendicular to the straight line connecting the first and second eccentric regions 221 and 222, as indicated by arrows, are passed. Accordingly, the obliquely incident lights passing through the first and second eccentric regions 221 and 222 are linearly polarized in the direction (Y-axis direction) perpendicular to the straight line connecting the first and second eccentric regions 221 and 222.

On the other hand, the perpendicularly incident light passing through the center region 220 is unpolarized or circularly polarized. The polarizers 231 and 232 do not need to be in contact with the illumination aperture 22 and may be disposed in the vicinity of the effective illumination source plane 23, apart from the illumination aperture 22.

The projection optical system 5 includes a projection lens 51 and an aperture stop 52. The plane surrounded by the aperture stop 52 is a pupil. An optical axis AX is a centerline of the light source 1, illumination optical system 2, and projection optical system 5.

Figure 3:
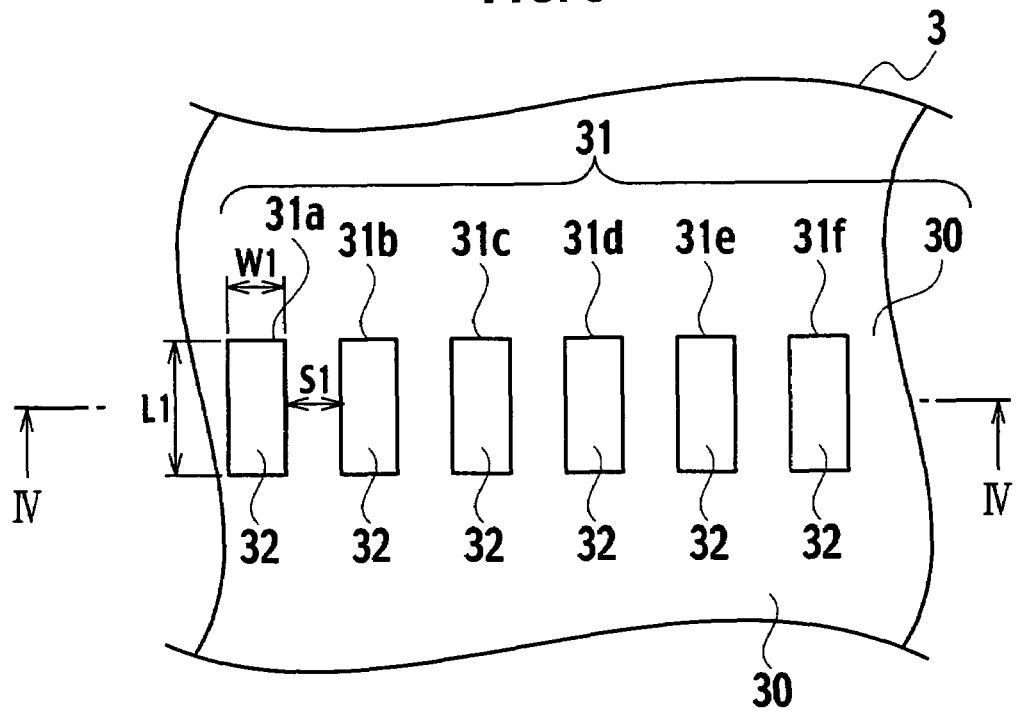
FIG. 3 is a plane view showing an example of a photomask according to the embodiment of the present invention.
Figure 4:
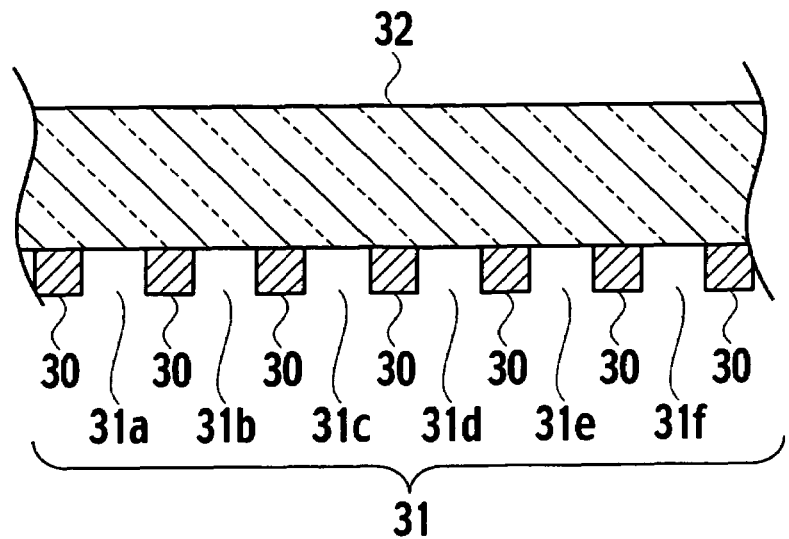
FIG. 4 is a cross-sectional view taking on line I-I in FIG. 3 and showing the example of the photomask according to the embodiment of the present invention.

The photomask 3 is an attenuated phase-shift mask including a mask pattern 31 shown in FIGS. 3 and 4. The mask pattern 31 includes a light shielding portion 30 disposed on a transparent substrate 32 and a plurality of openings 31a to 31f provided in the light shielding portion 30 and aligned in one direction. The openings 31a to 31f are patterns for forming a row of hole patterns on a wafer 6 as a resist pattern. Each of the openings 31a to 31f has a width W1 in the cyclic direction and a length L1 in a direction orthogonal to the cyclic direction (hereinafter, referred to as "isolation direction"). Space width S1 between each pair of adjacent openings 31a to 31f is substantially equal to the width W1 of the openings 31a to 31f.

Figure 5:
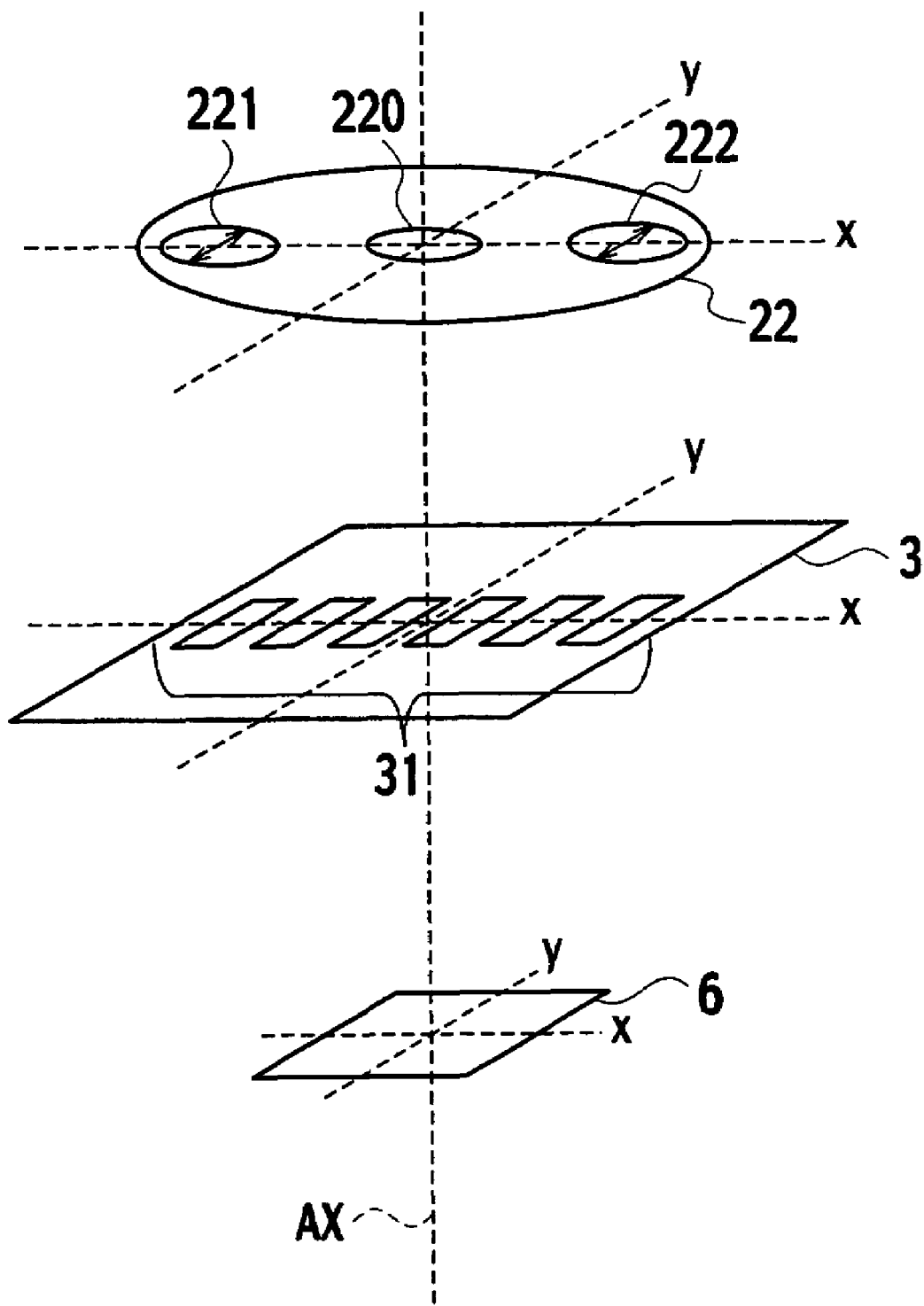
FIG. 5 is a schematic squint view for explaining a relationship between a position of illumination and a position of a mask pattern according to the embodiment of the present invention.

In exposing the wafer 6 with the mask pattern 31 of the photomask 3 shown in FIGS. 3 and 4, as shown in FIG. 5, an X-axis direction, in which the center region 220 and first and second eccentric regions 221 and 222 of the tripole illumination are aligned, is set parallel to the cyclic direction of the mask pattern 31 of the photomask 3. The light emitted from the light source 1 illuminates the photomask 3 placed on the mask stage 4 through the illumination optical system 2.

When the mask pattern 31 is illuminated, 0-th order to high order diffracted light is produced. When the cycle length of the openings 31a to 31f of the mask pattern 31 is shortened, angles of the diffracted light become large, and accordingly, only low-order diffracted light contributes to image formation. An optical image having a cycle length on the wafer 6 that is not more than wavelength of the light is therefore formed by interference of mainly two light beams of the 0-th order diffracted light (perpendicularly incident light) and first order diffracted light (obliquely incident light).

Figure 6:
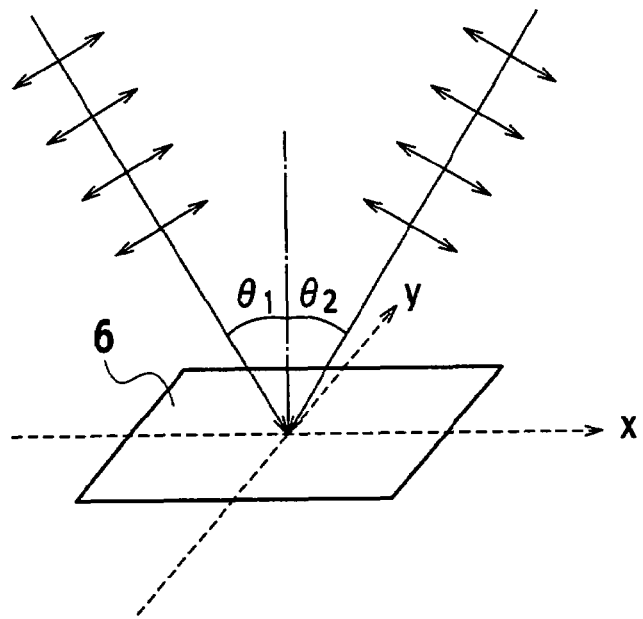
FIG. 6 is a schematic squint view for explaining p-polarization according to the embodiment of the present invention.

Desirably, as shown in FIG. 6, the obliquely incident lights passing through the first and second eccentric regions 221 and 222 are incident at angles θ1 and θ2 substantially symmetrical with respect to the normal to the upper surface of the wafer 6. The shorter the cycle of formed patterns, the larger the angles θ1 and θ2 at which the light is incident, and the lower the contrast of an interference pattern generated on the wafer 6. As shown in FIG. 6, when the vibration directions of the electric vectors of the obliquely incident lights passing through the first and second eccentric regions 221 and 222 are parallel to a plane of incidence (in the X-axis direction), that is, within the plane of incidence, the polarization of the light is called "p-polarization (or Transverse-Magnetic (TM) polarization)". In the case of p-polarization, the vibration directions of the electric vectors of the obliquely incident lights passing through the first and second eccentric regions 221 and 222 are not parallel to each other. Therefore the degree of interference between the obliquely incident lights is lower than that when the vibration directions of the electric vectors are parallel.

Figure 7:
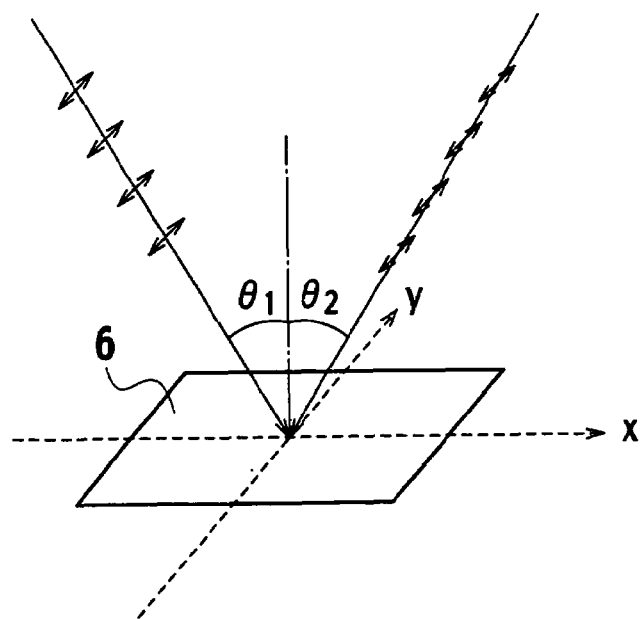
FIG. 7 is a schematic squint view for explaining a s-polarization according to the embodiment of the present invention.

On the other hand, as shown in FIG. 7, when the vibration directions of the electric vectors of the obliquely incident lights passing through the first and second eccentric regions 221 and 222 are perpendicular to the plane of incidence (in the Y-axis direction), the polarization of the light is called "s-polarization (or Transverse-Electric (TE) polarization)". In interference between the s-polarized lights, the vibration directions of the electric vectors of the obliquely incident lights are parallel to each other. Therefore the degree of interference between the obliquely incident lights is larger than that when the vibration directions of the electric vectors thereof are not parallel. The contrast is constant, independently of the incident angles θ1 and θ2 of the light. Accordingly, compared to the p-polarized light, the s-polarized light increases the contrast of the optical image and increases exposure latitude. Dimensional variation in a resist pattern on the wafer 6 can be therefore reduced.

Figure 8:
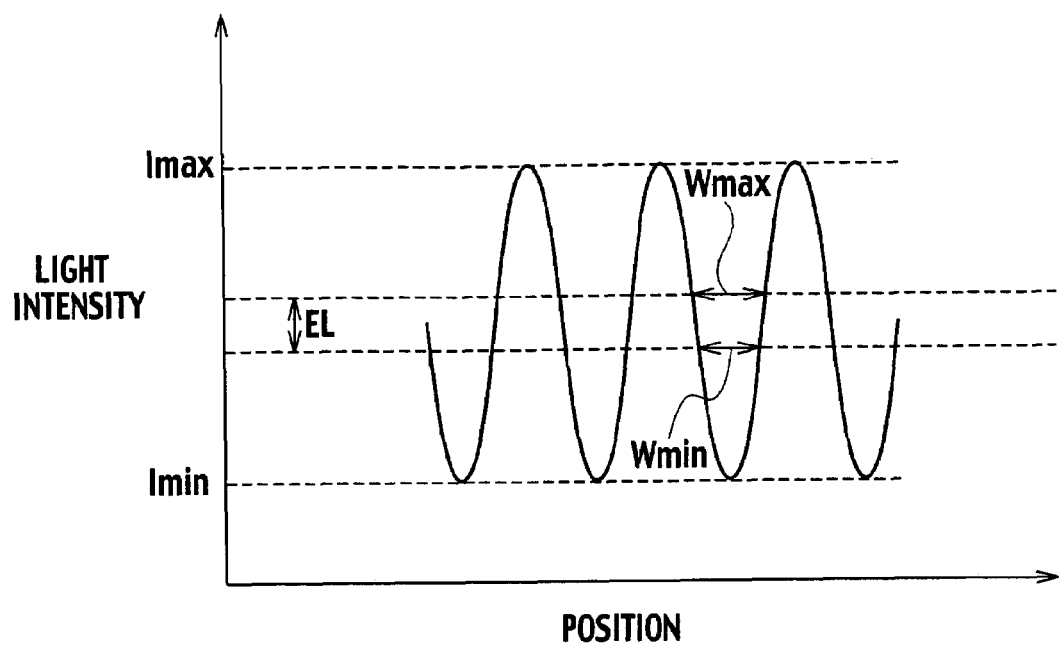
FIGS. 8 and 9 are graphs showing a relationship between contrast and exposure latitude.
Figure 9:
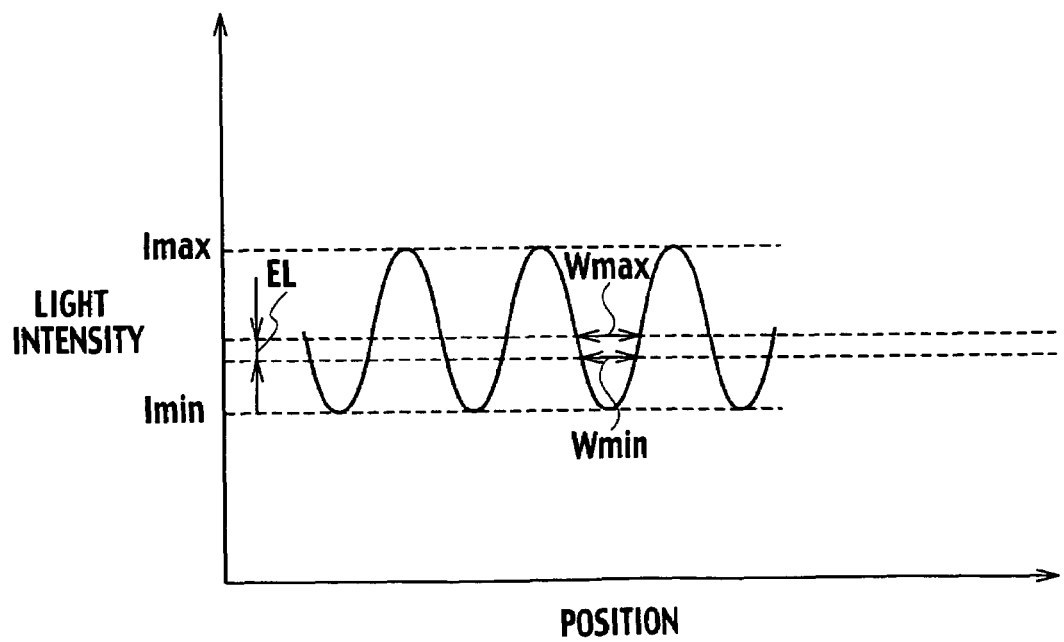

FIGS. 8 and 9 show a relationship between the contrast and the exposure latitude with respect to dimensions of the resist pattern. The dimensions of the resist pattern are approximately represented in a model in which, in an optical interference figure formed in the resist, the resist is exposed where the exposure amount exceeds a predetermined threshold value. The difference between maximum intensity $I_{max}$ and minimum intensity $I_{min}$ in an optical image shown in FIG. 8 is larger than that shown in FIG. 9, which means that the contrast of the optical image of FIG. 8 is higher than that of FIG. 9. When the contrast is high, the dimensional variation in a transferred pattern can be suppressed with respect to the variation in exposure amount.

On the other hand, when the contrast of the optical image is low, the variation in dimensional variation of the transferred pattern is increased by the variation in exposure amount. Accordingly, the contrast in an image formed by s-polarized light is higher than that in an image formed by p-polarized light or unpolarized light including p-polarized light and s-polarized light with the same intensity, and the exposure latitude EL by the s-polarized light is larger than that by the p-polarized light.

Figure 10:
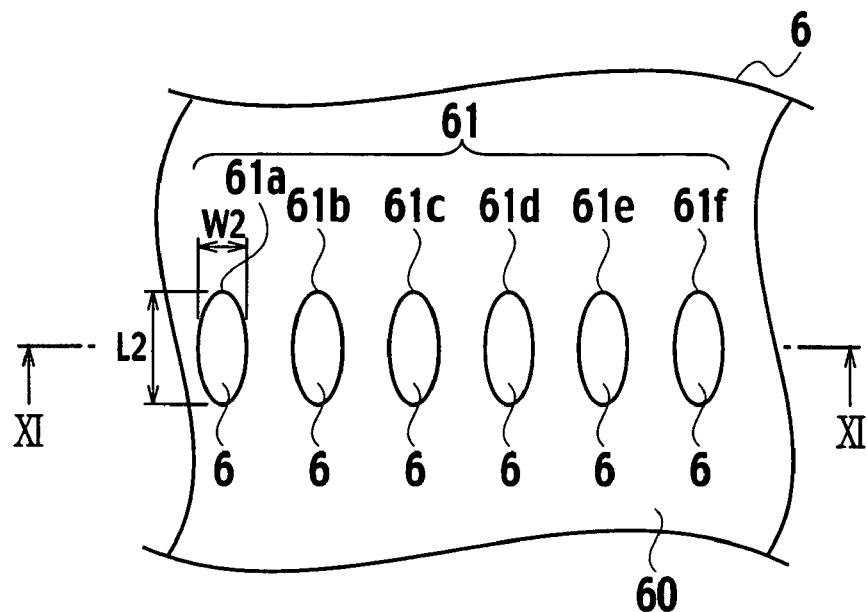
FIG. 10 is a plane view showing an example of a wafer according to the embodiment of the present invention.
Figure 11:
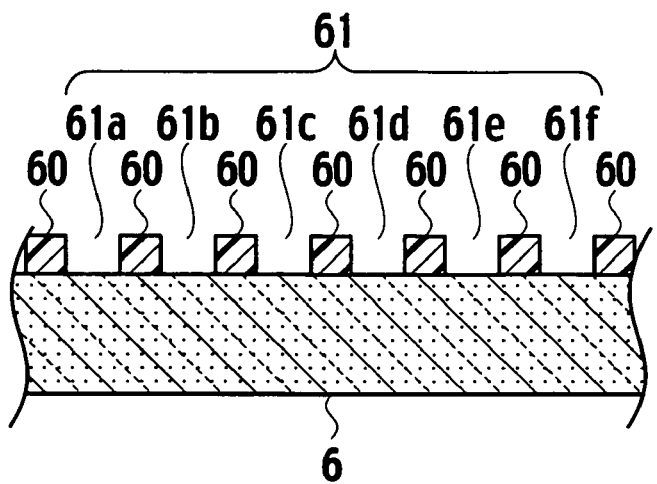
FIG. 11 is a cross-sectional view taking on line I-I in FIG. 10 and showing the example of the wafer according to the embodiment of the present invention.

The obliquely incident lights passing through the first and second eccentric regions 221 and 222 of the tripole illumination contribute to the formation of the optical image of a hole pattern row 61 on the wafer 6 shown in FIGS. 10 and 11 in the cyclic direction. When the obliquely incident lights are linearly polarized in the isolation direction, the image is formed by the s-polarized light on the upper surface of the wafer 6.

On the other hand, the perpendicularly incident light passing through the center region 220 does not contribute to image formation of pattern edges in the cyclic direction. The perpendicularly incident light incident in the photomask 3 is diffracted by the mask pattern 31 on the photomask 3 to produce diffracted light in the cyclic and isolation directions. The diffracted light in the cyclic direction has large angles of diffraction and cannot pass through the projection lens 51. The diffracted light produced in the isolation direction passes through the projection lens 51 and extend to the wafer 6 to form the pattern edges of the hole pattern row 61 in the isolation direction.

Accordingly, if these light beams are polarized in the isolation direction of the hole pattern row 61, the image is formed by the p-polarized light, and the exposure margin with respect to the dimension of the hole pattern row 61 in the isolation direction is reduced. It is therefore preferable that the perpendicularly incident light is not polarized in the isolation direction.

In the exposure system shown in FIG. 1, the hole pattern row 61 obtained by transferring the mask pattern 31 includes hole patterns 61a to 61f cyclically aligned in one direction on the wafer 6, as shown in FIGS. 10 and 11. The hole patterns 61a to 61f are patterns obtained by projecting the openings 31a to 31f shown in FIGS. 3 and 4 and have a width W2 in the cyclic direction and a length L2 in the isolation direction. The length of the cycle of repeating the hole patterns 61a to 61f in the cyclic direction is not more than the wavelength on the wafer 6, which is near the resolution limit of the exposure system. When the width W1 of the openings 31a to 31f of the mask pattern 31 is equal to the resolution limit or critical dimension (CD) of the exposure system, the shape and width W2 of the hole patterns 61a to 61f is varied by the optical proximity effect (OPE), the process proximity effect (PPE), and the like due to the pattern density.

Next, an exposure method according to the embodiment of the present invention will be described, referring to FIGS. 1, 2, 5, 7, 10 and 11.

(a) As shown in FIG. 1, a photomask 3 and a wafer 6 are provided on the mask stage 4 and the wafer stage 7, respectively. Thereafter, as shown in FIGS. 2 and 5, the aperture stop 52 forms the tripole illumination so that the cyclic direction of the mask pattern 31 of the photomask 3 corresponds to an axis direction connecting the first and second eccentric regions 221 and 222.

(b) In the exposure system shown in FIG. 1, the light source 1 emits light, which is unpolarized or circular polarized. In the illumination optical system 2, the light is passed through the condensing optical system 20 and the fly-eye lens 21. The polarizers 231 and 232 allow passage of only the perpendicular electric vector components in a direction (Y-axis direction) perpendicular to a straight line connecting the first and second eccentric regions 221 and 222, from among components of the circular polarized light or the unpolarized incident light. The first and second eccentric regions 221 and 222 form obliquely incident lights therethrough, which is linear polarized the direction (Y-axis direction) perpendicular to a straight line passing the first and second eccentric regions 221 and 222. The center region 220 forms a perpendicularly incident light, which is unpolarized or circular polarized. The obliquely incident lights, formed by the first and second eccentric regions 221 and 222, and the perpendicularly incident light formed by the center region 220 illuminate the mask pattern 31 of the photomask 3 shown in FIG. 5.

(c) The projection optical system 5 shown in FIG. 1 projects an image of the mask pattern 31 of the photomask 3 on the resist film 60 on the wafer 6. Here, the obliquely incident light formed by each of the first and second eccentric regions 221 and 222 is s-polarized light, as shown in FIG. 7, and illuminates the resist film 60 on the wafer 6. The resist film 60 is developed, and hole pattern rows 61 having hole patterns 61a to 61f shown in FIGS. 10 and 11 are formed.

According to the embodiment of the present invention, in forming a fine resist pattern like the hole pattern row 61 shown in FIGS. 10 and 11, the obliquely incident light formed by each of the first and second eccentric regions 221 and 222 is projected onto the resist film 60 on the wafer 6 as s-polarized light, so that the contrast in the optical image is larger than the that by the p-polarized light. The exposure latitude in the cyclic direction of the resist pattern can be increased without reducing the exposure latitude in the isolation direction. It is therefore possible to suppress the occurrence of dimensional variation of the resist pattern in the cyclic direction.

The effect of the s-polarized illumination on the increase in contrast depends on proportion of the s-polarized component in the entire light intensity. The obliquely incident light formed by each of the first and second eccentric regions 221 and 222 shown in FIG. 2 does not need to include only the s-polarized light component and may include a small amount of the p-polarized light component. Specifically, when the perpendicular electric vector component perpendicular to the straight line (Y-axis direction) connecting the first and second eccentric regions 221 and 222 is larger than the parallel electric vector component parallel to the straight line (X-axis direction), the exposure latitude is larger than the case where the obliquely incident light is unpolarized or circularly-polarized or the case where the perpendicular electric vector component perpendicular to the straight line (Y-axis direction) connecting the first and second eccentric regions 221 and 222 is smaller than the parallel electric vector component parallel to the straight line (X-axis direction).

Figure 12:
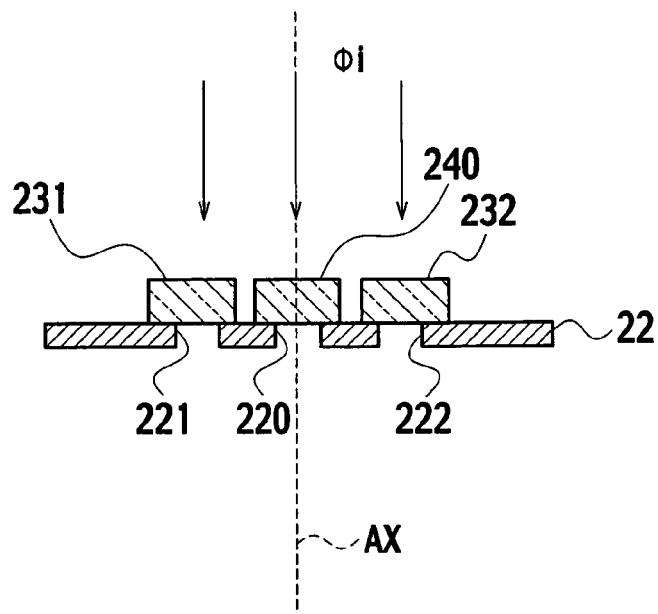
FIG. 12 is a cross-sectional view for explaining another example of the exposure system according to the embodiment of the present invention.

As shown in FIG. 12, a neutral density filter (ND filter) 240 reducing the intensity of light passing through the center region 220 may be placed on the optical path passing through the center region 220. When light passes through the polarizers 231 and 232, the intensity of the light is decreased, and the intensity of the perpendicularly incident light passing through the center region 220 not contributing the image formation in the cyclic direction is relatively increased to the obliquely incident lights passing through the first and second eccentric regions 221 and 222.

Accordingly, a proper exposure latitude cannot be obtained in some cases. When the neutral density filter 240 is placed in the vicinity of the center region 220 as shown in FIG. 12, by controlling the intensity of the perpendicularly incident light passing through the center region 220, the intensity of the perpendicularly incident light passing through the center region 220 can be set substantially equal to the intensity of the obliquely incident lights passing through the first and second eccentric regions 221 and 222. Therefore it is possible to obtain the proper exposure latitude.

Figure 13:
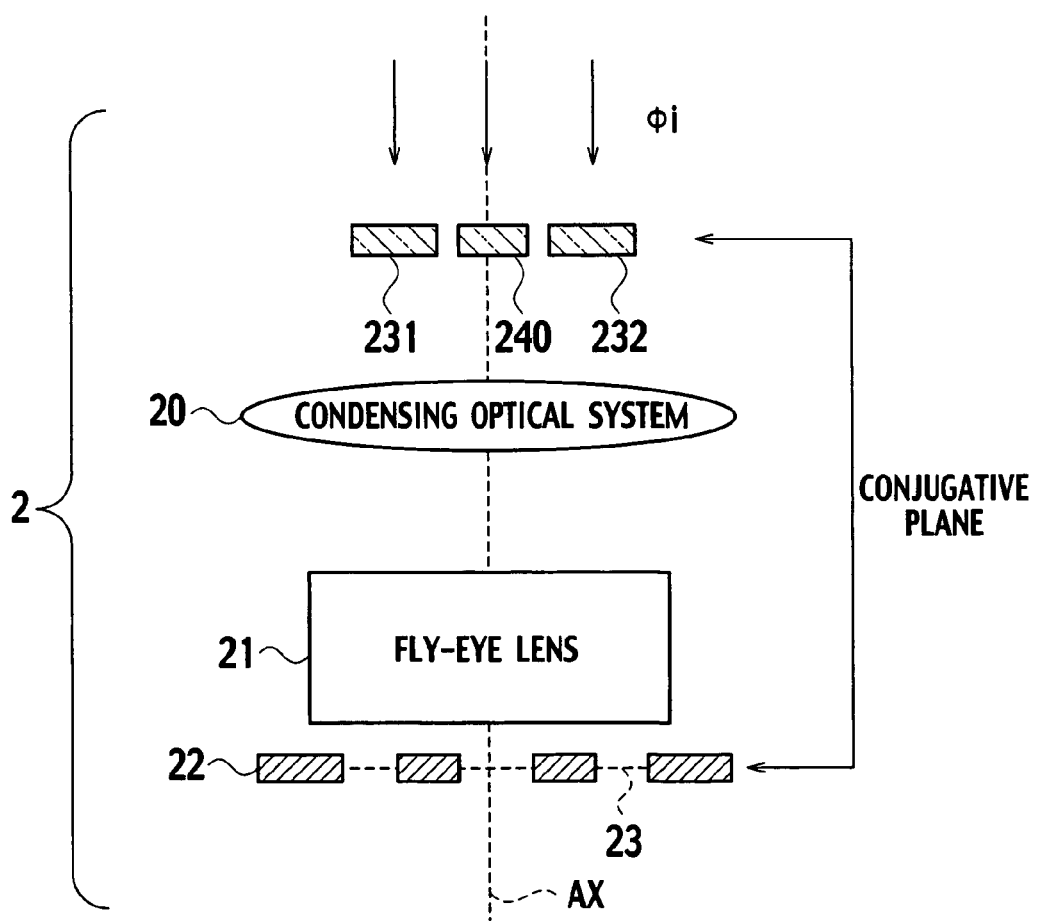
FIG. 13 is a cross-sectional view for explaining further example of the exposure system according to the embodiment of the present invention.

Moreover, the polarizers 231 and 232 and the neutral density filter 240 shown FIG. 12 do not need to be in contact with the aperture stop 22. For example, as shown in FIG. 13, the polarizers 231 and 232 and the neutral density filter 240 may be disposed in a plane conjugate with the effective illumination source surface 23 on the incident side of the aperture stop 22 so as to be spaced from the aperture stop 22.

Next, a method for manufacturing a semiconductor device will be described, referring to FIG. 14. The manufacturing method described below is one example, and it is feasible to substitute modifications by various other manufacturing methods.

First, in step S100, under a given system specification, process simulation, device simulation and circuit simulation are carried out, converting the functional design prescribed by the system specification into a logic design, which is then converted into a circuit representation.

Next, in step S200, the circuit representation of various circuit components is converted into a geometric representation of patterns so as to generate a plurality of mask data corresponding to each level of mask patterns. A mask pattern 31 shown in FIGS. 3 and 4 is delineated on a transparent substrate 32, and thereby a photomask 3 is produced. In addition to the photomask 3, each level of mask patterns is delineated on a plurality of mask substrates, each level corresponding to each step of the manufacturing process of the LSI, and a set of photomasks is produced.

Next, a series of processes including such as an oxidation process in step S310, a resist coating process in step S311, the photolithography process in step S312, an ion implantation process in step S313, a thermal treatment process in step S314, and the like are repeatedly performed in a front-end process (substrate process) in step 302.

In the photolithography process (step S312), the resist film coated in step S311 is delineated using a corresponding photomask 3 in the set of photomasks produced in the step S200. In the ion implantation process (step S313), the mask of the resist film delineated in the step S312 is used so as to selectively implant impurity ions into desired locations in a semiconductor wafer, through the oxide film formed on the semiconductor wafer in the step S310. The front-end process further includes various processes such as a combination of chemical vapor deposition (CVD) process and etching process, although not illustrated, and other processes are also carried out repeatedly in accordance with predetermined sequences.

Figure 14:
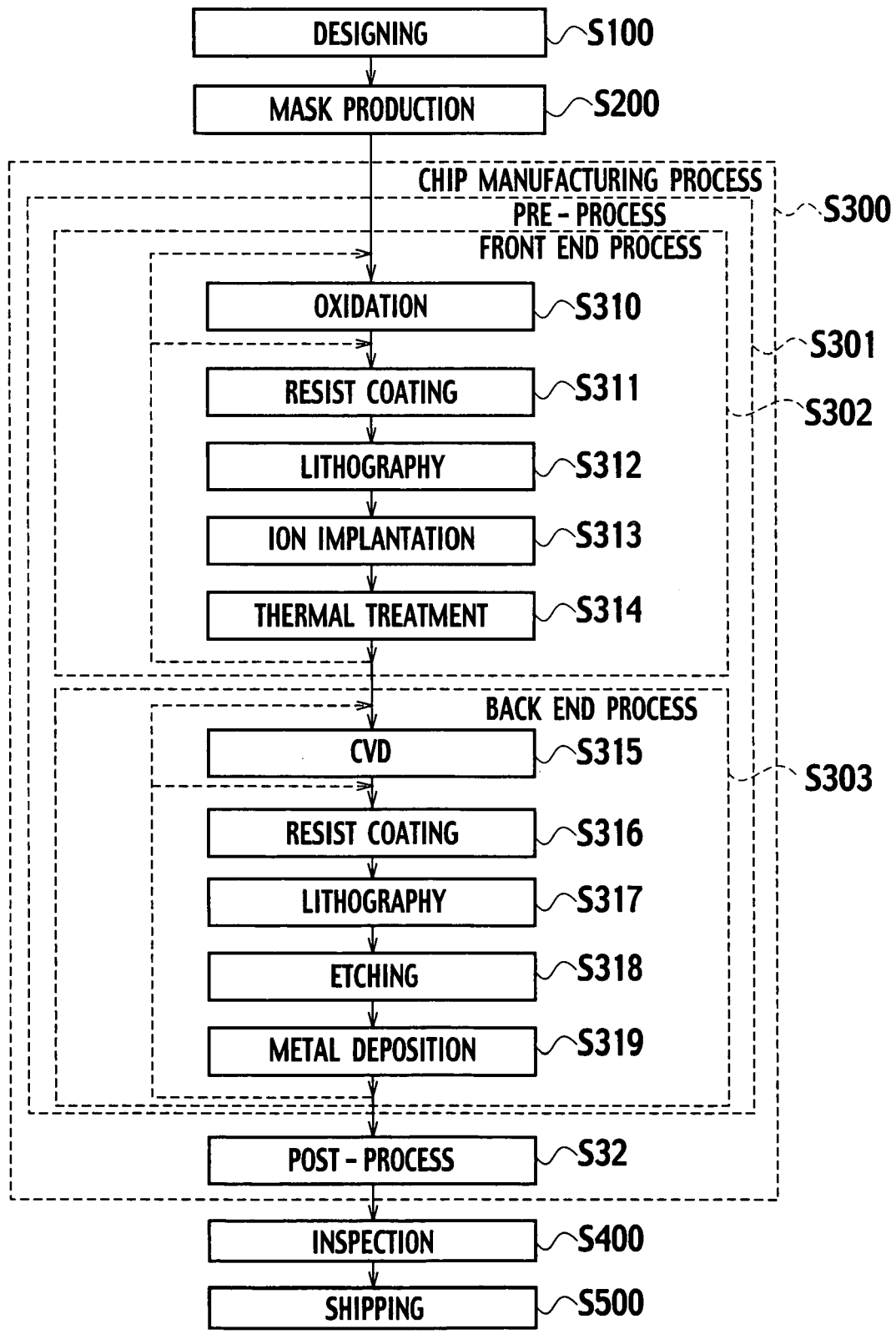
FIG. 14 is a flow chart for explaining an example of a method for manufacturing a semiconductor device according to the embodiment of the present invention.

FIG. 14 shows one example of a part of the front-end process. For example, the thermal treatment process of step S314 may be skipped, and the resist coating process of step S311 may be carried out immediately. Etching process may be carried out after step S312. The front-end process may include a combination of an etching process and an ion implantation process after the etching process. When the above-described series of processes are completed, the procedure advances to step S303.

Next, a back-end process (surface wiring process) for wiring the substrate surface is performed in step S303. A series of processes including a CVD process of an interlevel insulator in step S315, a resist coating process for coating a resist film on the interlevel insulator in step S316, the photolithography process of the resist film in step S317, a selective etching process of the interlevel insulator using the delineated resist film by step S317 as an etching mask in step S318, a metal deposition process to via holes and damascene trenches delineated in the interlevel insulator by step S318 in step 319, and the like are repeatedly performed in the back-end process. Although illustration is omitted, a metal film may be delineated by another lithography process and etching process after the deposition process of step S319. In the case of a damascene process, damascene trenches are delineated by lithography and etching after the etching process of step S318, and a metal deposition process of step S319 is carried out. Thereafter, a metal film is delineated by chemical mechanical polishing (CMP).

In step S317, using the exposure system shown in FIG. 1, the illumination shown in FIG. 2 is formed. That is, in the effective illumination source plane 23, the center region 220 forms the perpendicularly incident light. The first and second eccentric regions 221 and 222, which are opposite to each other with regard to the center region 220 in effective illumination source plane 23, form obliquely incident lights. In each of the obliquely incident lights, a perpendicular electric vector component perpendicular to a straight line connecting the first and second eccentric regions 221 and 222 is larger than a parallel electric vector component parallel to the straight line. The perpendicularly incident light and the obliquely incident lights illuminate a mask pattern 31 of the photomask 3 shown in FIGS. 3 and 4 produced in step S200. An image of the mask pattern 31 is projected to a resist film through the projection optical system 5. The resist film is developed, and as shown in FIGS. 10 and 11, resist patterns (hole pattern rows) 61 are delineated to the resist film. In step S318, using the hole pattern rows 61, the wafer is processed. When the above-described series of processes are completed, the procedure advances to step S304.

When a multi-level interconnection structure is completed and the pre-process is finished, the substrate is diced into chips of a given size by a dicing machine such as a diamond blade in step S304. A chip is then mounted on a packaging material made of metal, ceramic or the like. After electrode pads on the chip and leads on a leadframe are connected to one another, a desired package assembly process, such as plastic molding, is performed.

In step S400, the semiconductor device is completed after an inspection of properties relating to performance and function of the semiconductor device, and other given inspections on lead shapes, dimensional conditions, a reliability test, and the like.

In step S500, the semiconductor device, which has cleared the above-described processes, is packaged to be protected against moisture, static electricity and the like, and is then shipped out.

As described above, according to the method for manufacturing a semiconductor device pertaining to the embodiment of the present invention, it is possible to prevent occurrence of dimensional variation in the cyclic direction of a fine resist pattern such as the hole pattern rows 61 with respect to variation of exposure amount. Therefore it is possible to improve manufacturing yield of a semiconductor device.

Although the hole pattern rows 61 are formed in step S317, the effective illumination source shown in FIG. 2 may be used in the photolithography process of step S312. The effective illumination source may be adapted to another process when required. For example, in the photolithography process in step S312, the effective illumination source may be adapted to form an etching mask for etching gate electrodes of Metal-Oxide Semiconductor Field-Effect Transistor (MOSFET).

(First Modification)

Figure 15:
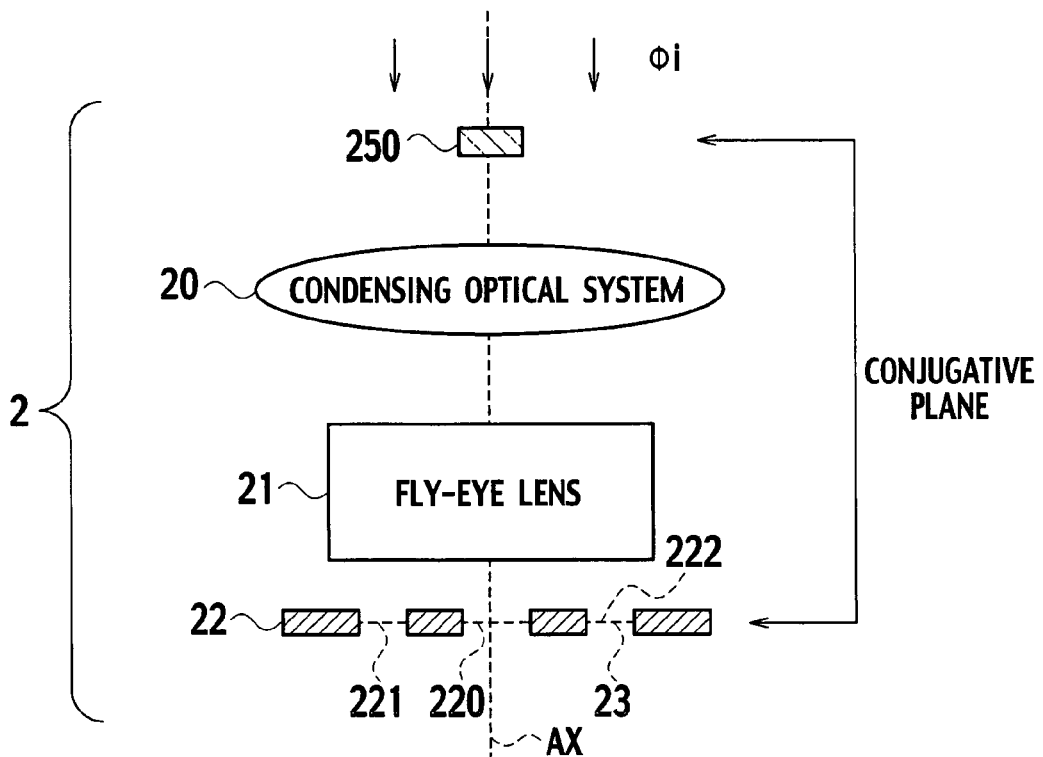
FIG. 15 is a cross-sectional view showing an example of an illumination optical system according to a first modification of the embodiment of the present invention.

In a first modification of the embodiment of the present invention, the vibration direction of the electric vectors of the light emitted from the light source 1, shown in FIG. 1, is extended in the perpendicular direction (Y-axis direction) to the straight line passing through the first and second eccentric regions 221 and 222, shown in FIG. 2. As shown in FIG. 15, a quarter wave plate 250 is placed in the optical path of the light passing through the center region 220 of the effective illumination source plane 23 in a plane conjugate with the effective illumination source plane 23. The quarter wave plate 250 changes the incident linearly polarized light into circularly polarized light. As shown in FIG. 2, therefore, in the effective illumination source plane 23, obliquely incident light which is linearly polarized such that the vibration direction of the electric vectors is extended in the isolation direction of the mask pattern 31 are formed by each of the first and second eccentric regions 221 and 222. In addition, a circularly polarized perpendicularly incident light is formed by the center region 220.

According to the first modification, even when the light beam emitted from the light source 1 is linear polarized light, the dimensional variation of the resist pattern can be reduced in a manner similar to the embodiment by the quarter wave plate 240.

Figure 16:
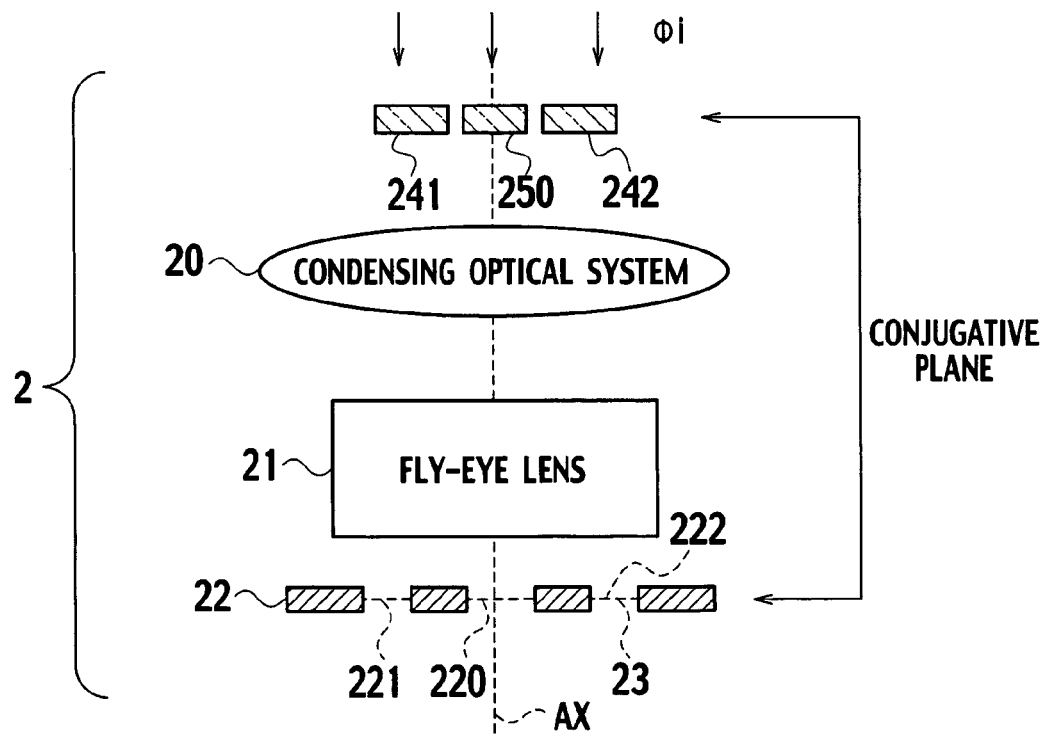
FIG. 16 is a cross-sectional view showing another example of the illumination optical system according to the first modification of the embodiment of the present invention.

As shown in FIG. 16, the neutral density filters 241 and 242 may be placed in optical paths where the quarter wave plate 240 is not provided in a plane which is optically conjugate with the effective illumination source plane 23 and in which the quarter wave plate 250 is placed. The neutral density filters 241 and 242 allow adjustment of the light intensity distribution of the effective illumination source so that the intensity of the light passing through the quarter wave plate 250 is set equal to that of the light not passing through the quarter wave plate 250.

Figure 17:
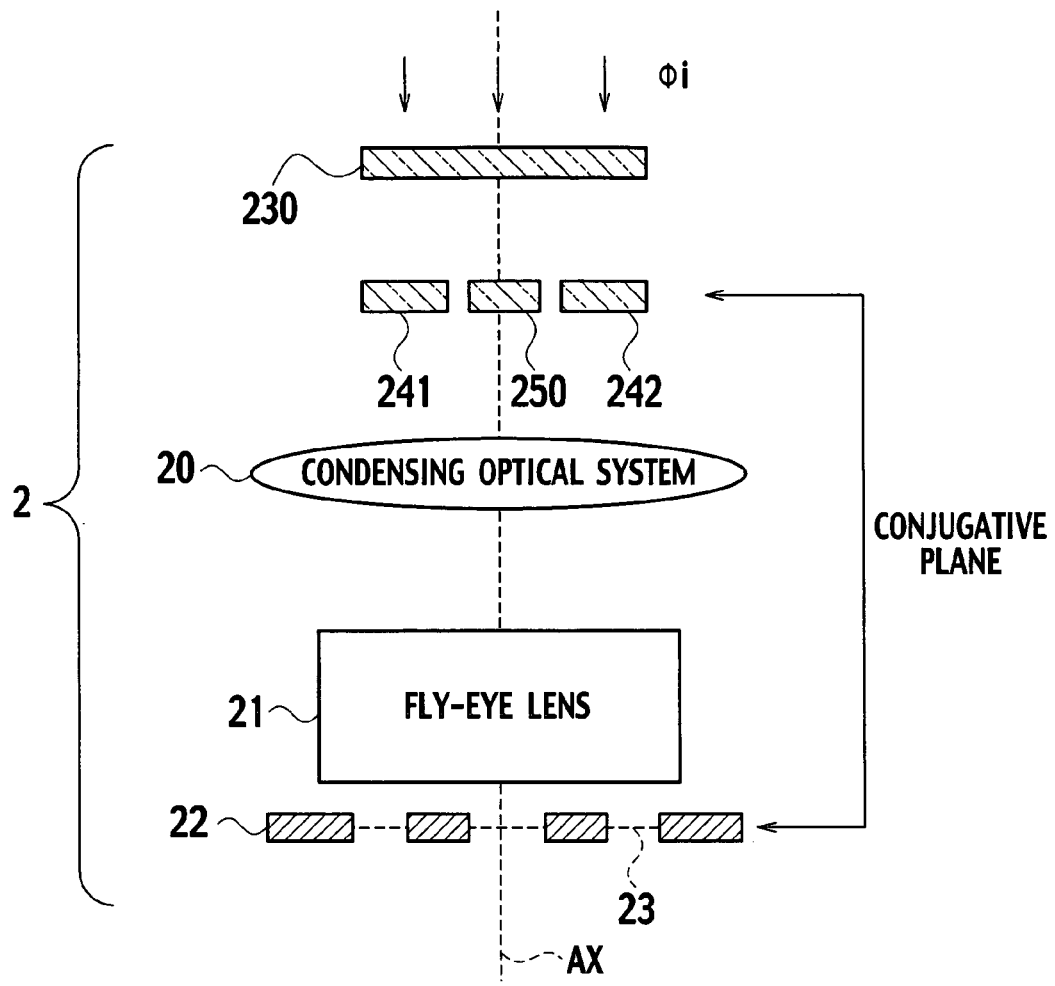
FIG. 17 is a cross-sectional view showing further example of the illumination optical system according to the first modification of the embodiment of the present invention.

Moreover, in the first modification, also in the case where the light emitted from the light source 1 is unpolarized or circularly polarized, as shown in FIG. 17, the quarter wave plate 250 and the neutral density filters 241 and 242 may be placed in the plane optically conjugate with the effective illumination source plane 23. A polarizer 230 is placed on the incident side of the quarter wave plate 250. The polarizer 230 changes the unpolarized or circular polarized light into linear polarized light such that the vibration direction of the electric vectors is extended in the perpendicular direction (Y-axis direction) to the straight line passing through the first and second eccentric regions 221 and 222 shown in FIG. 2. This allows the adjustment of the light intensity distribution in a similar way to the case where the vibration direction of the electric vectors is extended in the perpendicular direction (Y-axis direction) to the straight line passing through the first and second eccentric regions 221 and 222 shown in FIG. 2.

(Second Modification)

Figure 18:
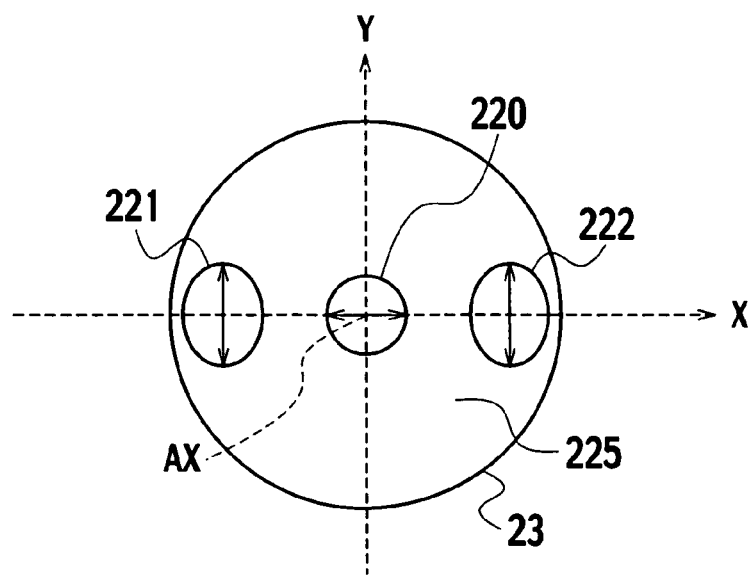
FIG. 18 is a schematic plane view showing an example of a tripole illumination according to a second modification of the embodiment of the present invention.
Figure 19:
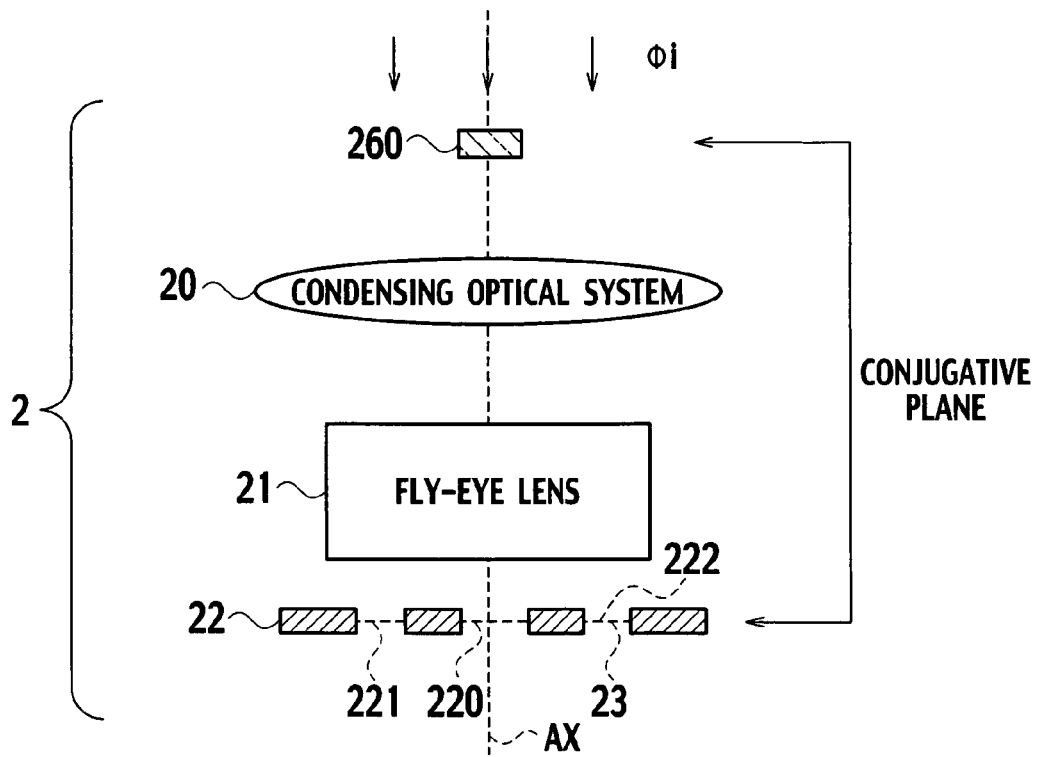
FIG. 19 is a cross-sectional view showing an example of an illumination optical system according to the second modification of the embodiment of the present invention.

In a second modification of the embodiment of the present invention, a description is given of an example, in which, as shown in FIG. 18, the vibration directions of the electric vectors of the perpendicularly incident light passing through the center region 220 is equal to the parallel direction (X-axis direction) to the straight line connecting the first and second eccentric regions 221 and 222. As shown in FIG. 19, a half wave plate 260 is placed in the optical path passing through the center region 220 of the effective illumination source plane 23 in a plane conjugate with the effective illumination source plane 23. The half wave plate 260 rotates the vibration directions of the electric vectors of incident linear polarized light by 90 degrees.

In the effective illumination source plane 23, as shown in FIG. 18, the perpendicularly incident light passing through the center region 220 is linearly polarized. The vibration direction of the electric vectors of the perpendicularly incident light is extended in the isolation direction of the mask pattern 31 shown in FIGS. 3 and 4. The perpendicularly incident light passing through the center region 220 is diffracted in the mask pattern 31 on the photomask 3 to produce diffracted light within a plane including the cyclic direction and within a plane including the isolation direction. The diffracted light in the plane including the cyclic direction has large angles of diffraction and cannot pass through the projection lens 51, thus not contributing to the formation of the resist pattern.

On the other hand, the diffracted light produced in the plane including the isolation direction pass through the projection lens 51 and reach the wafer 6, thus forming the pattern edges of the hole pattern row 61 shown in FIGS. 10 and 11 in the isolation direction. Accordingly, when the perpendicularly incident light is linearly polarized in the direction parallel to the cyclic direction of the hole pattern row 61, image formation is performed by the s-polarized light, and the exposure latitude with respect to the dimension of the hole pattern rows 61 in the isolation direction is increased compared to the case where the perpendicularly incident light is circularly polarized or unpolarized. The perpendicularly incident light does not contribute to the formation of the edges of the hole pattern row 61 in the cyclic direction. Accordingly, even if the polarization of the perpendicularly incident light from the center region 220 is changed, the exposure latitude in the cyclic direction of the hole pattern row 6 does not change.

According to the second modification, in the formation of the fine hole pattern row 61, the exposure latitude in the isolation direction can be increased without reducing the exposure latitude in the direction that the patterns are densely arranged. It is therefore possible to suppress the occurrence of the dimensional variation in the hole pattern row 61 due to the variation in exposure.

Figure 20:
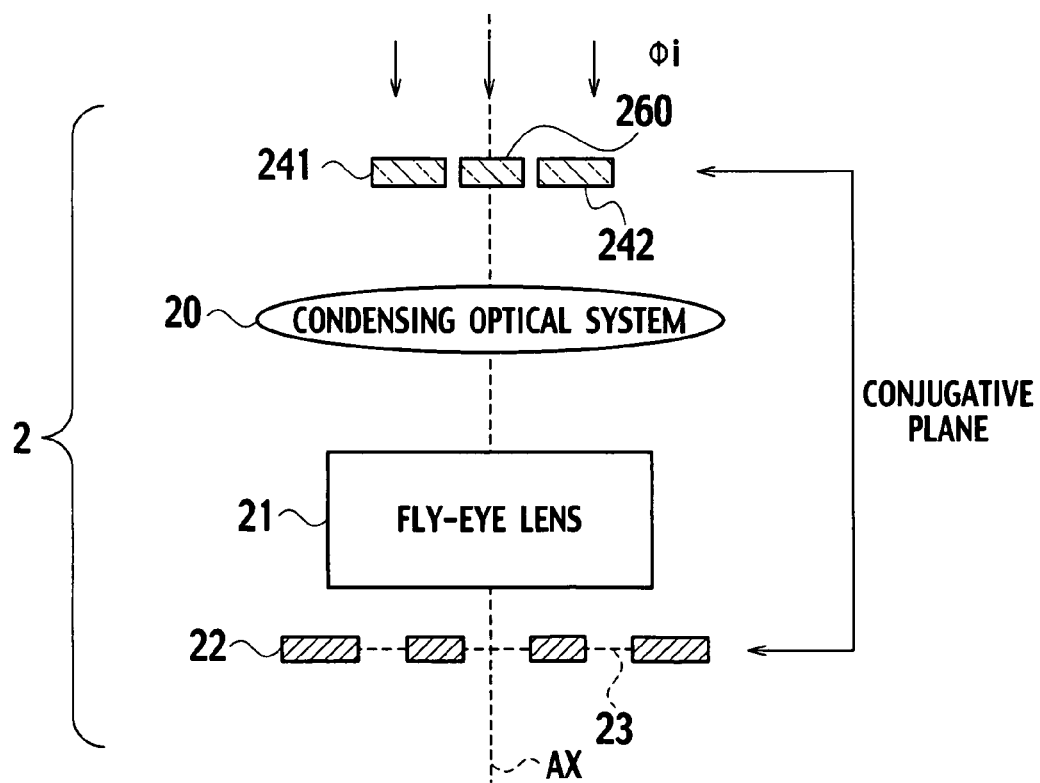
FIG. 20 is a cross-sectional view showing another example of the illumination optical system according to the second modification of the embodiment of the present invention.

As shown in FIG. 20, the neutral density filters 241 and 242 may be placed in the plane where the half wave plate 260 is placed and in an optical path in which the half wave plate 260 is not located. The neutral density filters 241 and 242 allow adjustment of the illumination, so that the intensity of the light not passing through the half wave plate 260 can be set equal to that of light passing through the half wave plate 260.

(Third Modification)

Figure 21:
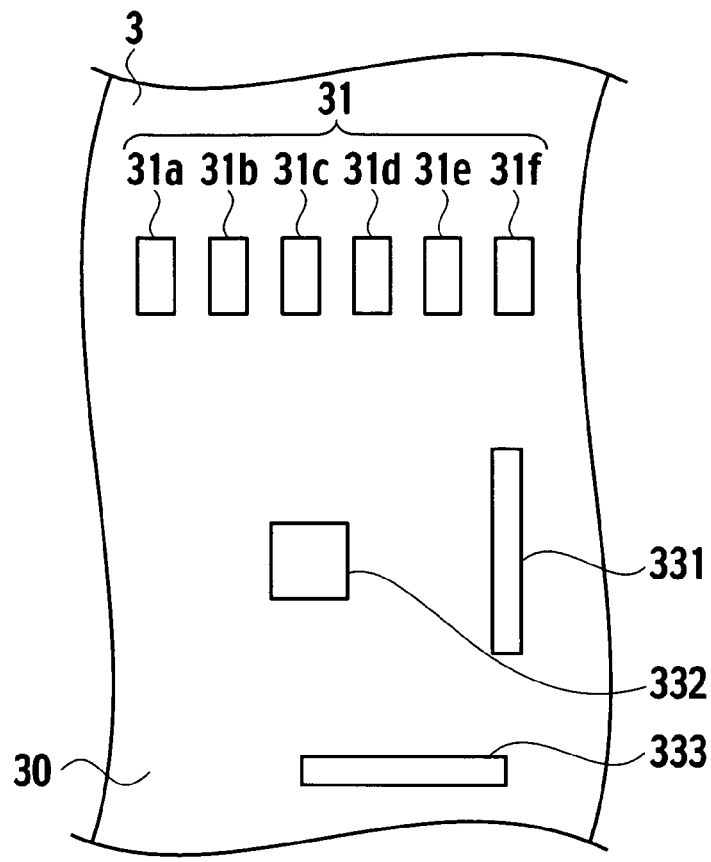
FIG. 21 is a plane view showing an example of a photomask according to a third modification of the embodiment of the present invention.

In a third modification of the embodiment of the present invention, as shown in FIG. 21, a description is given of an example in which the photoresist 3 includes patterns 331, 332, and 333 of various shapes in addition to the mask pattern 31 with the openings 31a to 31f. The pattern 331 shown in FIG. 21 is a thin line pattern extending in the isolation direction of the openings 31a to 31f. The pattern 332 is a rectangular pattern. The pattern 333 is a thin line pattern extending in the cyclic direction of the openings 31a to 31f.

In the projection exposure using the photomask 3 shown in FIG. 21, using the tripole illumination shown in FIGS. 2 and 18, the exposure latitude with respect to the dimension in the isolation direction is different from the exposure latitude with respect to the dimension in the cyclic direction, resulting in problems. This is because the illumination is different between the isolation direction of the openings 31a to 31f and the cyclic direction thereof. For example, in FIG. 21, the rectangular pattern 332 is deformed so that lengths of adjacent sides thereof are different, and the lengths of vertical and horizontal lines change by different amounts.

Figure 22:
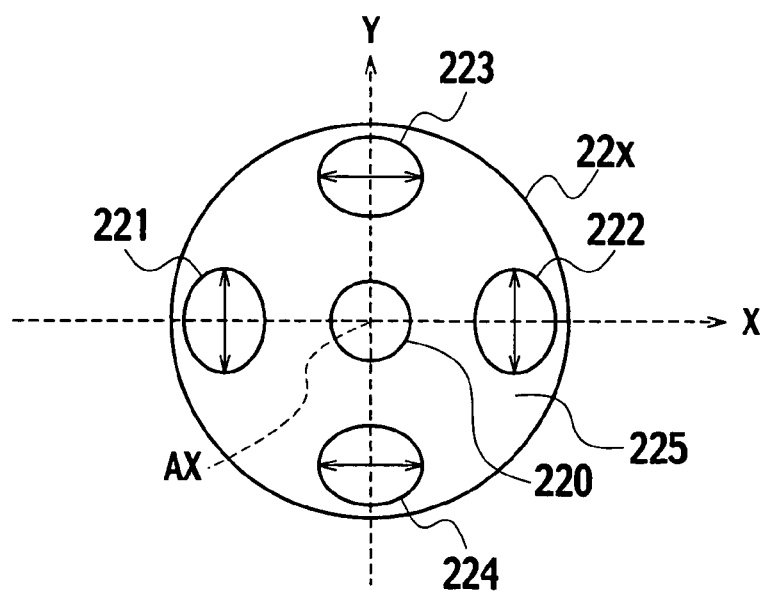
FIG. 22 is a schematic plane view showing an example of a 5-pole illumination according to the third modification of the embodiment of the present invention.

In this case, it is preferable to use "5-pole illumination" shown in FIG. 22 as the type of illumination. The 5-pole illumination includes, in addition to the center region 220 with the maximum light intensity, the two first and second eccentric regions 221 and 222 with the maximum light intensity and two third and fourth eccentric regions (transparent regions) 223 and 224. The first and second eccentric regions 221 and 222 are located across the optical axis AX at equal distances from the optical axis AX on a straight line intersecting with the optical axis AX. The third and fourth eccentric regions 223 and 224 are located across the optical axis AX at equal distances from the optical axis AX on a straight line perpendicular to the straight line connecting the first and second eccentric regions.

The first and second eccentric regions 221 and 222 and the third and fourth eccentric regions 223 and 224 are disposed so as to have rotational symmetry through 90 degrees around the optical axis AX. At least one of the straight lines connecting the first and second eccentric regions 221 and 222 and connecting the third and fourth eccentric regions 223 and 224 is parallel to the cyclic direction of the mask pattern 31 on the photomask 3 shown in FIG. 21

As shown in FIG. 22, each of an obliquely incident light passing through the first to fourth eccentric regions 221 to 224 is formed into linearly polarized light in which the vibration directions of the electric vectors are orthogonal to respective lines connecting the center of the effective illumination source and the first to fourth eccentric regions 221 to 224. The light passing through the first to fourth eccentric regions 221 to 224 is effective on the formation of edges of the hole pattern row 61 shown in FIGS. 10 and 11 in the cyclic direction. The perpendicularly incident light passing through the center region 220 is circularly polarized or unpolarized. In the 5-pole illumination shown in FIG. 22, the light intensity distribution in the X-axis direction is the same as that in the Y-axis direction.

Accordingly, the exposure latitude with respect to the dimension in the isolation direction of the hole pattern row 61 is the same as that with respect to the dimension in the cyclic direction. It is therefore possible to achieve image formation of the patterns 331 to 333 shown in FIG. 21. However, when the cycle length of the openings 31a to 31f is short, sufficient exposure latitudes cannot be obtained in some cases.

According to the third modification, the exposure latitude of a row of dense hole patterns is increased, and resist patterns other than the row of dense hole patterns maintain good dimensional accuracy. It is therefore possible to suppress the dimensional variation of the dense hole patterns and the other patterns due to the variation in exposure amount.

Figure 23:
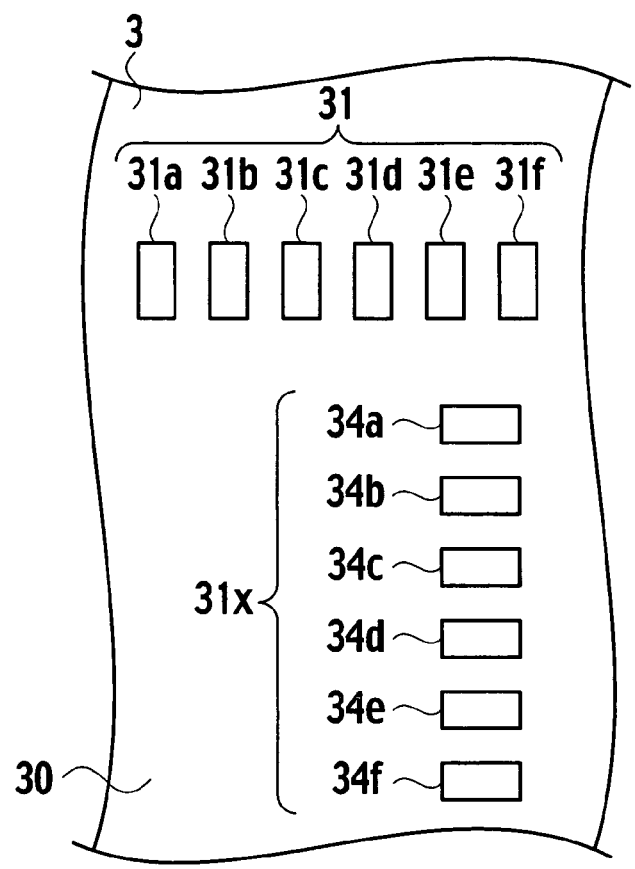
FIG. 23 is a plane view showing another example of the photomask according to the third modification of the embodiment of the present invention.

In the third modification, as shown in FIG. 23, the photomask 3 may include a mask pattern 31x for forming a row of fine hole patterns with a cyclic direction at 90 degrees with respect to the cyclic direction of the openings 31a to 31f constituting the hole pattern row. In projection exposure of the mask patterns 31 and 31x, if the tripole illumination shown in FIGS. 2 and 18 is used, the hole patterns aligned in the vertical direction are not resolved in the dense direction.

Also in this case, using the 5-pole illumination shown in FIG. 22, the hole pattern rows corresponding to the mask patterns 31 and 31x can be formed.

OTHER EMBODIMENTS

Various modifications will become possible for those skilled in the art after receiving the teachings of the present disclosure without departing from the scope thereof.

In the description of the embodiment, the photomask 3 shown in FIGS. 3 and 4 is an attenuated phase-shift mask including the light shielding portion 30 and openings 31a to 31f. However, the photomask 3 may be a binary mask, an alternating phase-shift mask, a chromeless mask, or the like.

Figure 24:
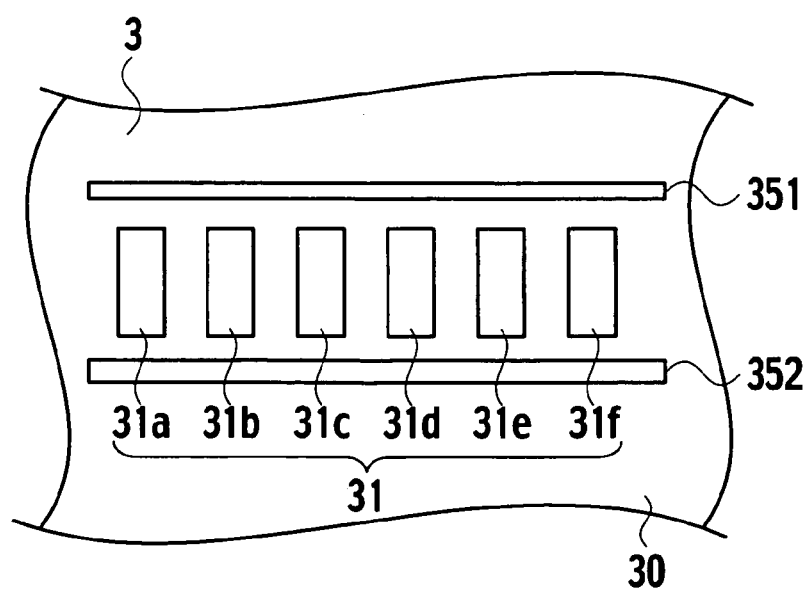
FIG. 24 is a plane view showing an example of a photomask according to other embodiment of the present invention.
Figure 25:
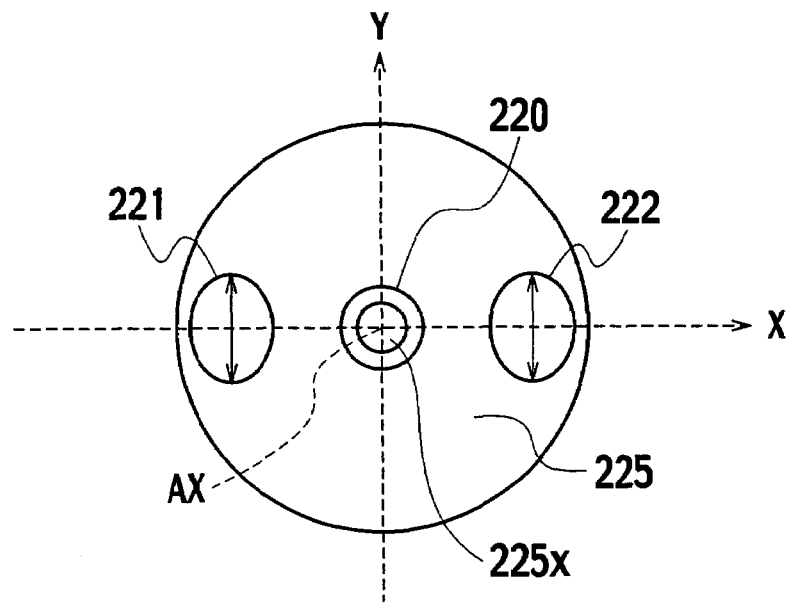
FIG. 25 is a plane view showing an example of an illumination according to the other embodiment of the present invention.

As shown in FIG. 24, in the photomask 3, in addition to the openings 31a to 31f for forming the hole pattern row 61, unresolved patterns 351 and 352, which are also called assist patterns or subresolution assist feature (SRAF), may be arranged. The unresolved patterns 351 and 352 are not resolved on the wafer 6. By use of the unresolved patterns 351 and 352, the exposure latitude or depth of focus with respect to the dimension in the isolation direction of the hole pattern row is further increased, and the dimensional accuracy is increased. Also, in transferring the mask pattern 31 of the photomask 3, it is possible to achieve further increased exposure latitude and dimensional accuracy by using the tripole illumination or 5-pole illumination shown in FIGS. 2, 18, and 22.

Furthermore, various types of illumination in addition to the illumination shown in FIGS. 2, 18, and 22 may be used. For example, an illumination in which the center region 220 is annular can be used. Within the center region 220, a light shielding region 225x is disposed. The light intensity of the light shielding region 225x is lower than that of the center region 220 and first and second eccentric region 221 and 222.

Figure 26:
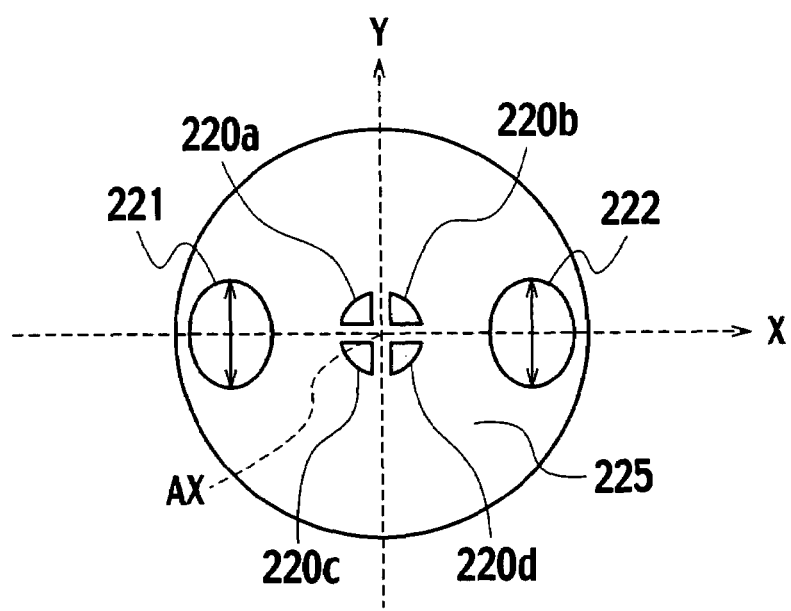
FIG. 26 is a plane view showing another example of the illumination according to the other embodiment of the present invention.

Furthermore, the illumination shown in FIG. 26 may be used. This illumination has a shape such that the center region 220, shown in FIG. 2, is divided by the peripheral region 225 in the X- and Y-axis directions through the optical axis AX. In FIG. 26, four center regions 220a to 220d are disposed. In other words, the "center region" does not need to be on the optical axis AX and may be disposed in the vicinity of the optical axis AX.

What is claimed is:

1. An exposure system comprising:
an illumination optical system configured to define, in an effective illumination source plane, a center region forming a perpendicularly incident light having an optical axis perpendicular to a plane of a mask pattern and first and second eccentric regions being opposite to each other with regard to the center region in the effective illumination source plane, each of the first and second eccentric regions forming an obliquely incident light having an optical axis oblique to the plane of the mask pattern and having a perpendicular electric vector component perpendicular to a straight line connecting the first and second eccentric regions in the effective illumination source plane, the electric vector component being larger than a parallel electric vector component parallel to the straight line, and to illuminate the mask pattern with the perpendicularly incident light and the obliquely incident lights; and
a projection optical system configured to project an image of the mask pattern to a processing object with the perpendicularly incident light and the obliquely incident lights.

2. The exposure system of claim 1, wherein the effective illumination source plane is substantially equal to a plane of a Fourier transform relationship of the plane of the mask pattern.

3. The exposure system of claim 1, wherein each of the obliquely incident lights illuminates the mask pattern at angles symmetrical with respect to a normal to the plane of the mask pattern.

4. The exposure system of claim 1, wherein each of the obliquely incident lights has a different polarization from the perpendicularly incident light.

5. The exposure system of claim 1, wherein each of the obliquely incident lights is linear polarized perpendicular to the straight line.

6. The exposure system of claim 1, wherein the perpendicularly incident light is one of a circular polarized light and an unpolarized light.

7. The exposure system of claim 1, wherein the perpendicularly incident light has a parallel electric vector component parallel to the straight line, which is lager than a perpendicular electric vector component perpendicular to the straight line.

8. The exposure system of claim 1, wherein the perpendicularly incident light is linear polarized parallel to the straight line.

9. The exposure system of claim 1, further comprising a polarizer, provided in an optical path passing the first and second eccentric regions in one of a vicinity of the effective illumination source plane and a plane conjugate with the effective illumination source plane, configured to change each of the obliquely incident light into linear polarized light.

10. The exposure system of claim 9, further comprising a neutral density filter, provided in an optical path passing the center region in one of a vicinity of the effective illumination source plane and a plane conjugate with the effective illumination source plane, configured to reduce light intensity of the perpendicularly incident light.

11. The exposure system of claim 1, further comprising a quarter wave plate, provided in an optical path passing the center region in one of a vicinity of the effective illumination source plane and a plane conjugate with the effective illumination source plane, configured to change the perpendicularly incident light into circular polarized light.

12. The exposure system of claim 11, further comprising a neutral density filter, provided in an optical path passing the first and second eccentric regions in one of a vicinity of the effective illumination source plane and a plane conjugate with the effective illumination source plane, configured to reduce light intensity of the obliquely incident lights.

13. The exposure system of claim 1, further comprising a half wave plate, provided in an optical path passing the center region in one of a vicinity of the effective illumination source plane and a plane conjugate with the effective illumination source plane, configured to rotate vibration directions of the electric vectors of the obliquely incident lights by 90 degrees.

14. The exposure system of claim 1, wherein the illumination optical system further forms third and fourth eccentric regions, rotationally symmetric with respect to the first and second eccentric regions through 90 degrees around an optical axis, each configured to define another obliquely incident lights having a perpendicular electric vector component in a perpendicular to a straight line connecting the third and fourth eccentric regions that is larger than a parallel electric vector component parallel to the straight line connecting the third and fourth eccentric regions.

15. The exposure system of claim 1, wherein the mask pattern comprises openings cyclically aligned in one direction in a light shielding portion of a photomask.

16. The exposure system of claim 15, wherein the mask pattern further comprises an unresolved pattern extending in the one direction of the light shielding portion.

17. An exposure method comprising:
  forming, from a center region in an effective illumination source plane, a perpendicularly incident light having an optical axis perpendicular to a plane of a mask pattern;
  forming obliquely incident lights having an optical axis oblique to the plane of the mask pattern, from each of first and second eccentric regions opposite to each other with regard to the center region in the effective illumination source plane, and having a perpendicular electric vector component perpendicular to a straight line connecting the first and second eccentric regions, the perpendicular electric vector component being larger than a parallel electric vector component parallel to the straight line;
  illuminating the mask pattern with the perpendicularly incident light and the obliquely incident lights; and
  projecting an image of the mask pattern on a processing object.

18. The exposure method of claim 17, wherein forming the obliquely incident lights comprises:
  forming the obliquely incident lights illuminating the mask pattern at angles symmetrical with respect to a normal to the plane of the mask pattern.

19. The exposure method of claim 17, wherein forming the obliquely incident lights comprises:
  further forming additional obliquely incident lights illuminating the mask pattern from each of third and fourth eccentric regions having rotational symmetry with respect to the first and second eccentric regions through 90 degrees around an optical axis, and having a perpendicular electric vector component perpendicular to a straight line connecting the third and fourth eccentric regions that is larger than a parallel electric vector component parallel to the straight line.

20. A method for manufacturing a semiconductor device comprising:
  coating a resist film on a semiconductor wafer;
  forming, from a center region in an effective illumination source plane, a perpendicularly incident light having an optical axis perpendicular to a plane of a mask pattern;
  forming obliquely incident lights having an optical axis oblique to the plane of the mask pattern, from each of first and second eccentric regions opposite to each other with regard to the center region in the effective illumination source plane, and having a perpendicular electric vector component perpendicular to a straight line connecting the first and second eccentric regions, the perpendicular electric vector component being larger than a parallel electric vector component parallel to the straight line;
  illuminating the mask pattern with the perpendicularly incident light and the obliquely incident lights;
  projecting an image of the mask pattern to the resist film;
  developing the resist film so as to form a resist pattern; and
  processing the semiconductor substrate by using the resist pattern as a processing mask.

* * * * *